United States Patent

Rigal et al.

[11] Patent Number: 5,877,544
[45] Date of Patent: Mar. 2, 1999

[54] ELECTRONIC MICROPACKAGE FOR AN ELECTRONIC MEMORY CARD

[75] Inventors: Vincent Rigal, Sceaux; Eric Daniel, Issy-les-Moullineaux, both of France

[73] Assignee: Schlumberger Industries, Montrouge, France

[21] Appl. No.: 698,581

[22] Filed: Aug. 15, 1996

[30] Foreign Application Priority Data

Aug. 23, 1995 [FR] France ................... 95 10019

[51] Int. Cl.[6] .................. H01L 23/02; H01L 23/495; H01L 23/48; H01L 23/04
[52] U.S. Cl. .................. 257/679; 257/668; 257/678; 257/692; 257/730
[58] Field of Search .................. 257/668, 678, 257/679, 730, 692

[56] References Cited

U.S. PATENT DOCUMENTS

| | | | |
|---|---|---|---|
| 4,955,132 | 9/1990 | Ozawa | 29/840 |
| 5,070,390 | 12/1991 | Shimizu | 257/668 |
| 5,382,829 | 1/1995 | Inoue | 257/659 |
| 5,399,903 | 3/1995 | Rostoker et al. | 257/666 |
| 5,455,454 | 10/1995 | Oh et al. | 257/676 |
| 5,598,031 | 1/1997 | Grover et al. | 257/668 |

FOREIGN PATENT DOCUMENTS

| | | | |
|---|---|---|---|
| A-0 197 438 | 10/1986 | European Pat. Off. . | |
| A-0 344 058 | 11/1989 | European Pat. Off. . | |
| A-0 371 855 | 6/1990 | European Pat. Off. . | |
| 2 488 446 | 11/1984 | France . | |
| 55-1153 | 1/1980 | Japan | 257/668 |
| 89 04552 | 5/1989 | WIPO | 257/668 |

*Primary Examiner*—Teresa M. Arroyo
*Attorney, Agent, or Firm*—Frishauf, Holtz, Goodman, Langer & Chick, P.C.

[57] ABSTRACT

An electronic micropackage for an electronic memory card, particularly applicable to large-sized semiconductor chips. The micropackage includes a semiconductor chip disposed on a first face of an insulating support, and electrical contact zones extending along a plane defined by a second face of the insulating support. The semiconductor chip is connected to the electrical contact zones via connection wires. A metal strip is provided with cut-outs defining the electrical contact zones. A strip of insulating material is disposed on one face of the metal strip, the strip of insulating material constituting said insulating support, and leaving uncovered, at least in part, the electrical contact zones. A housing for the semiconductor chip, surrounding the insulating support and obstructing those cut-outs in the metal strip which are inside the housing and which are not obstructed by the insulating support. A coating of resin covers the semiconductor chip and the connection wires, at least partially filling the housing.

7 Claims, 3 Drawing Sheets

ELECTRONIC MICROPACKAGE FOR AN ELECTRONIC MEMORY CARD

FIELD OF THE INVENTION

The present invention relates to an electronic micropackage for an electronic memory card, and to a method of making such a micropackage. A particularly advantageous application of the invention is to electronic memory cards having microprocessors, in particular microprocessors constituted by large-sized semiconductor chips.

BACKGROUND OF THE INVENTION

Two main techniques are currently known for making electronic micropackages or modules designed for electronic memory cards.

In a first technique described in French Patent No. 2 488 446, for example, a strip of insulating material, such as polyethylene or an epoxy resin, is perforated so as to provide holes through which connection wires can pass to connect the semiconductor chip to electrical contact zones. A metal strip is laminated on the strip of insulating material, and is then removed by chemical etching so as to form electrical contact zones on which protective layers are deposited. The protective layers are gold layers deposited on the metal forming the contact zones, which is generally copper. Since copper is likely to be oxidized when exposed to the ambient atmosphere, the gold layers are deposited to prevent such oxidation. In a subsequent stage, the semiconductor chip is glued onto the strip of insulating material or into a window pre-cut in the strip together with the through holes. The semiconductor chip is then connected to the electrical contact zones via connection wires passing through the through holes. Finally, the semiconductor chip and the connection wires are protected against mechanical and chemical damage by a coating of epoxy resin obtained by molding or by merely depositing a drop of resin.

A second technique described in French Patent No. 2639763 includes mechanically cutting out a metal strip, curving it, and then overmolding insulating material onto it while leaving uncovered the cut-out zones in the metal strip, which zones constitute the electrical contact zones of the electronic module. The term "overmolding" describes forming a shape by merely pouring a molding material over an object, in contrast to "molding" which suggests the presence of a mold wherein the object is positioned in place before the mold is filled with molding material. The metal is thus held securely in the overmolded insulating material by means of the initial curving of the strip, thereby mechanically securing the cut-out metal zones. The insulating overmolding also forms a cup in which the semiconductor chip is glued and connected to the electrical contact zones via connection wires. Protecting the semiconductor chip and the connection wires is thus made considerably easier because it suffices merely to fill the cup with a liquid resin.

Unfortunately, these two known techniques suffer from various drawbacks when large-sized semiconductor chips are to be protected. With the first technique, the difficulty lies, firstly, in the cost of the resulting micropackage due in particular to the chemical etching step during which the laminated metal strip is etched and, secondly, in the protective coating for protecting the semiconductor chip and the connection wires because it is very difficult to coat over a large area without increasing its thickness to a prohibitive extent. With the second technique, the difficulty lies in forming the cup bottom which must be very fine but must extend over a large area with good surface evenness.

SUMMARY OF THE INVENTION

An object of the present invention is provide an electronic micropackage for an electronic memory card of the type described above, which is well suited to large-sized semiconductor chips.

This and other objects of the invention are attained by a micropackage that includes a metal strip provided with cut-outs defining electrical contact zones. A strip of insulating material is disposed on one face of the metal strip, the strip of insulating material constituting an insulating support, and leaving uncovered, at least in part, the electrical contact zones. A housing for the semiconductor chip surrounds the insulating support and obstructs those cut-outs in the metal strip which are inside the housing and which are not obstructed by the insulating support. A coating of resin covers the semiconductor chip and the connection wires, at least partially filling the housing.

It can thus be understood that the overmolded housing in which the semiconductor is placed prevents the resin from spreading, and thus makes it possible to obtain a coating that is accurately dimensioned geometrically, in particular with respect to its thickness.

The invention also includes two side strips of insulating material on either side of the above-mentioned insulating strip that leave uncovered the electrical contact zones, at least in part, and are also disposed on the face of the metal strip. It is then possible to insert the micropackage of the invention into a cavity provided in the body of an electronic memory card by gluing the two side strips, and optionally the free ends of the "central" first strip of insulating material, against the edges of the cavity.

According to another aspect of the invention, a method of making an electronic micropackage for an electronic memory card is provided, with the micropackage including a semiconductor chip disposed on a first face of an insulating support, and electrical contact zones extending along a plane defined by a second face of the insulating support, the semiconductor chip being connected to the electrical contact zones via connection wires.

In accordance with steps of such method, cut-outs are formed for defining the electrical contact zones in a metal strip. A strip of insulating material is disposed on one face of the metal strip, the strip of insulating material constituting the insulating support, and leaving uncovered at least in part, the electrical contact zones. A housing for the semiconductor chip is overmolded around the insulating support, which housing obstructs those cut-outs in the metal strip that are inside the housing and which are not obstructed by the insulating support. The semiconductor chip is disposed on the insulating support inside the housing. The semiconductor chip is connected to the electrical contact zones by means of the connection wires. The semiconductor chip and the connection wires are coated with a resin deposited in the housing. Then, the metal strip around the housing is cut so as to form the micropackage.

The invention offers a number of significant advantages, including the following. Cutting out electrical contact zones in the metal strip is easy and cheap, and also very reliable. The strips of insulating material have very even plane surfaces, making it easier to glue them to the semiconductor chip, and subsequently to glue the micropackage in the cavity of the card body. Depositing the resin in the overmolded housing becomes a simple operation. The overmolded housing forms a stiffener which protects the semiconductor chip against bending. The strips of insulating material may be very fine, thereby reducing the total thickness of the assembly, and forming resilient portions suitable for mechanically decoupling the semiconductor chip from the points at which the micropackage is fastened in the cavity of the card body. The strips of insulating material form a natural mask during the surface treatment step during which the surface of the metal strip is treated by electrolytic deposition, thereby enabling a saving in the precious metals deposited.

BRIEF DESCRIPTION OF THE DRAWINGS

The invention and how it may be implemented can be understood from the following description given by way of non-limiting example and with reference to the accompanying drawings, in which.

DETAILED DESCRIPTION OF THE PREFERRED EMBODIMENT(S)

Figure 5:
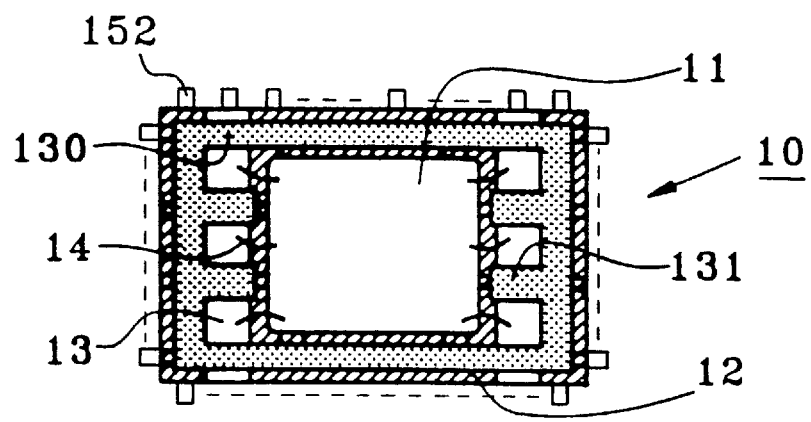
FIG. 5 is a plan view of a micropackage of the invention.
Figure 6:
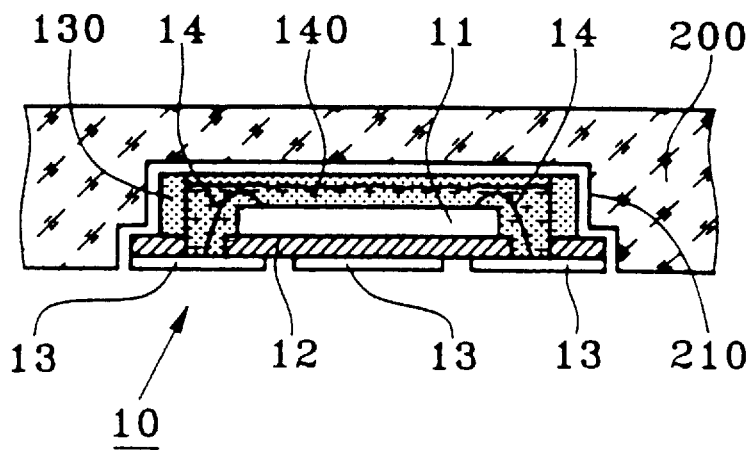
FIG. 6 is an end view in section through the micropackage shown in FIG. 5, as inserted in a cavity found in the body of an electronic memory card.

FIGS. 5 and 6 show a micropackage 10 for an electronic memory card. Micropackage 10 includes a semiconductor chip 11 disposed on a first face of an insulating support 12, and electrical contact zones 13 extending along a plane defined by a second face of said insulating support 12, said semiconductor chip 11 being connected to said electrical contact zones 12 via connection wires 14.

Figure 1:
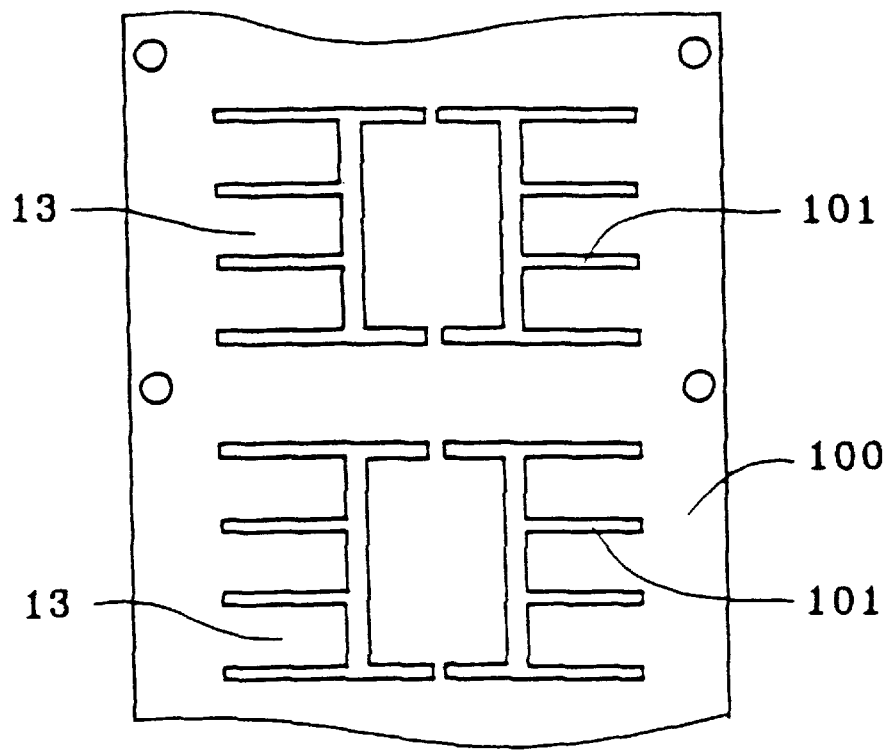
FIG. 1 is a plan view of a metal strip cut out using the method of the invention.

FIGS. 1 to 4 show the various steps of a method for making the electronic micropackage 10. The first step, shown in FIG. 1, is forming cut-outs 101 defining the electrical contact zones 13 in a metal strip 100. The metal of the metal strip 100 may advantageously be bronze. Bronze can be cut easily, it withstands corrosion well, and it is available in the form of thin films.

Figure 2:
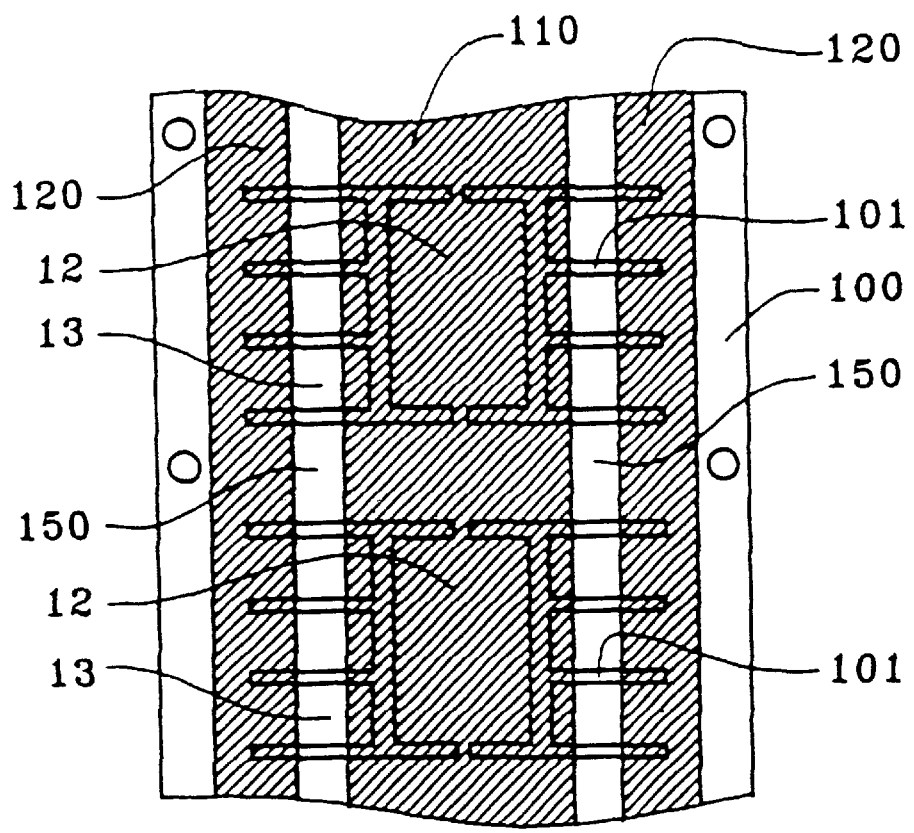
FIG. 2 is a plan view of the metal strip shown in FIG. 1, on which strip a central strip and two side strips of insulating material are deposited.

Then, as shown in FIG. 2, a central strip 110 of insulating material that constitutes the insulating support 12 on which the semiconductor chip is to be placed is disposed on one face of the metal strip 100. Two side strips 120, also made of an insulating material, are disposed laterally of central strip 110 and on the same face of the metal strip 100. The central strip 110 and the side strips 120 of insulating material are spaced from each other and so arranged as to leave uncovered at least part of the electrical contact zones 13.

The insulating material used may be Kapton (registered trademark) or, preferably, polyethylene. Polyethylene is cheaper, it is available in good quality thin films, and it can be coated. Its mechanical properties, in particular its dimensional stability are not as good as those of Kapton, but this handicap does not rule it out because the strips 110, 120 do not need to be placed with perfect accuracy on the metal strip 100.

It should also be noted that the central strip 110 and the side strips 120 may be made of different materials, and/or they may be of different thicknesses. For example, the side strips 120 may be more flexible than the central strip 110.

In a particular embodiment, each of the strips 110, 120 of insulating material is formed of a core made of a plastic material that is mechanically and thermally strong, a first face of the core carrying an adhesive layer suitable for securing said strips 110, 120 to the metal strip 100.

If necessary, at this stage of the method, a surface treatment step may be performed on the metal strip by electrolytic deposition over areas 150 of nickel and of gold, for example, the strips 110, 120 of insulating material forming masks for defining the zones to which said treatment is applied, with all the resulting savings in deposited metals.

Figure 3:
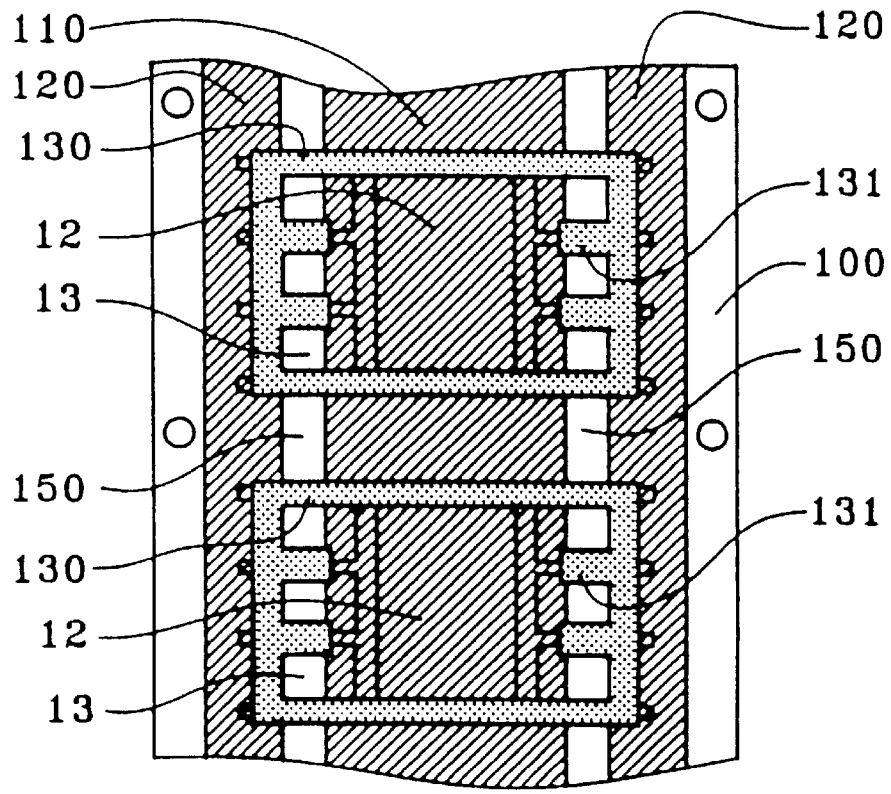
FIG. 3 is a plan view of the assembly shown in FIG. 2, on which assembly the overmolded housing of the invention is formed.

As indicated in FIG. 3, a housing 130 for the semiconductor chip 11 is then formed by overmolding around the insulating support 12. The housing is provided with projections 131 designed to obstruct the cut-outs 101 in the metal strip 100 that lie inside the housing 130 and which are not obstructed by the insulating support 12. A perfectly sealed housing is thus obtained. The overmolding material used is preferably a thermoplastic. It must be moldable in thin walls and have very low shrinkage. It may be a CTP or an LCP (Liquid Crystal Polymer) which has excellent fluidity when hot. The material also advantageously has good rigidity when cold.

The strips 110, 120 of insulating material may be bonded to the overmolded material of the housing 130 by means of a second adhesive layer carried by each of said strips 110, 120 on a second face. The material of the housing 130 may then be chosen for its mechanical and molding characteristics alone, independently of its adhesion capacities.

Figure 4:
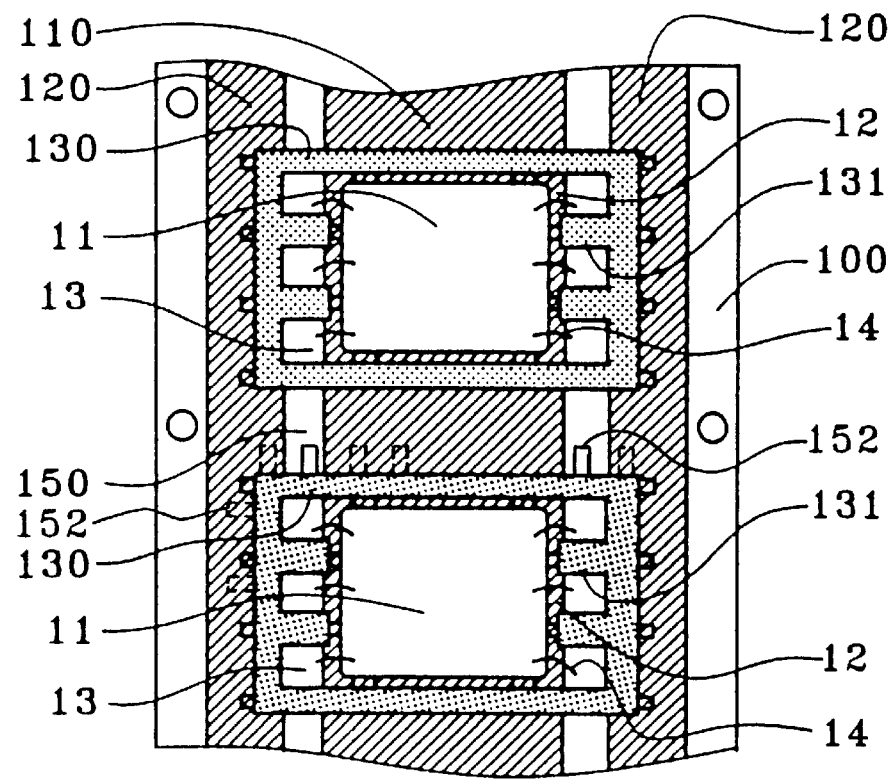
FIG. 4 is a plan view of the structure of the micropackage shown in FIG. 3, in which micropackage a semiconductor chip is placed.

In a subsequent step, shown in FIG. 4, the semiconductor chip 11 is placed on the insulating support 12 inside the overmolded housing 130. Then, the semiconductor chip 11 is connected to the electrical contact zones 13 by means of connection wires 14, e.g. gold wires.

Finally, the semiconductor chip 11 and the connection wires 14 are coated with a resin 140 deposited in the housing 130, as shown in FIG. 6.

The final step of the method of the invention is cutting the metal strip 100 around the housing 130 so as to form the micropackage 10 as shown in FIG. 5.

FIG.6 shows that the resulting micropackage 10 can be inserted in a cavity 210 provided in the body 200 of an electronic memory card. The micropackage 10 is advantageously secured in the cavity 210 by means of the second layer of adhesive which bonds the strips 110, 120 of insulating material to the housing 130, thereby avoiding an additional step in which an adhesive is deposited that is specific to gluing the micropackage to the card body. In such a case, the second adhesive layer is a reactivatable glue which, even though it has been heated once for gluing, can be heated again to perform another gluing operation. One alternative is for the second adhesive layer to be merely an anchoring layer for the glue that is to be applied to secure the micropackage.

A variant implementation of the method consists in cutting out decoupling slots 152 in the metal strip outside the housing. These slots increase the flexibility of the micropackage in its peripheral portions, outside the housing. In contrast, the housing and the coating of resin that it contains form a rigid assembly protecting the semiconductor chip against bending. The decoupling slots 152 act as springs which can absorb external bonding stresses after micropackage 10 is inserted in the electronic memory card. Otherwise, these stresses could be transmitted to the chip, resulting in possible breaking of the connection wires 14.

Although a detailed description of the preferred embodiments has been provided above, it will be readily apparent to one with ordinary skill in the art that various modifications thereto can be made without departing from the spirit and scope of the invention as defined by the following claims.

We claim:

1. An electronic micropackage for an electronic memory card, the micropackage including a semiconductor chip disposed on a first face of an insulating support, and electrical contact zones extending along a plane defined by a second face of the insulating support, said semiconductor chip being connected to the electrical contact zones via connection wires, wherein the micropackage comprises:

a metal strip provided with cut-outs defining said electrical contact zones;

a strip of insulating material disposed on one face of said metal strip, a portion of the strip of insulating material constituting the insulating support, and leaving uncovered, at least in part, said electrical contact zones;

a housing for the semiconductor chip, surrounding the insulating support and obstructing those of said cut-outs in the metal strip that are inside said housing and which are not obstructed by the insulating support; and a coating of resin for covering the semiconductor chip and the connection wires, at least partially filling the housing.

2. An electronic micropackage according to claim 1, wherein two side strips of insulating material leaving uncovered said electrical contact zones at least in part are also disposed on said one face of said metal strip.

3. An electronic micropackage according to claim 1, wherein said strip of insulating material is formed of a core made of a plastic material and having at least a first face carrying an adhesive layer suitable for securing said strip of insulating material to the metal strip.

4. An electronic micropackage according to claim 1, wherein said strip of insulating material is formed of a core made of a plastic material and having a second face carrying an adhesive layer suitable for bonding it to said housing.

5. An electronic micropackage according to claim 4, wherein said adhesive layer on said second face is also suitable for securing the micropackage in a cavity provided in the body of an electronic memory card.

6. An electronic micropackage according to claim 1, wherein said metal strip carries surface treatment on zones defined by at least one strip of insulating material.

7. An electronic memory card including an electronic micropackage according to claim 1, the micropackage being placed in a cavity provided in a card body.

* * * * *